United States Patent
Murray et al.

(10) Patent No.: US 6,429,744 B2
(45) Date of Patent: Aug. 6, 2002

(54) METHOD FOR BIAS RAIL BUFFERING

(75) Inventors: Kenneth W. Murray; Joel M. Halbert, both of Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/904,806

(22) Filed: Jul. 13, 2001

Related U.S. Application Data

(63) Continuation of application No. 09/692,017, filed on Oct. 19, 2000, which is a continuation of application No. 09/215,402, filed on Dec. 18, 1998, now Pat. No. 6,163,216.

(51) Int. Cl.$^7$ ................................................. H03F 3/26
(52) U.S. Cl. ......................... 330/267; 330/263; 330/268
(58) Field of Search .............................. 330/267, 268, 330/263

(56) References Cited

U.S. PATENT DOCUMENTS

| | | | | |
|---|---|---|---|---|
| 4,176,323 A | * | 11/1979 | Odell | 330/263 |
| 4,274,059 A | * | 6/1981 | Okabe | 330/266 |
| 4,366,442 A | * | 12/1982 | Yamada | 330/51 |
| 4,401,951 A | * | 8/1983 | Tanaka | 330/268 |
| 4,586,001 A | * | 4/1986 | Pye | 330/267 |

* cited by examiner

Primary Examiner—Robert Pascal
Assistant Examiner—Henry Choe
(74) Attorney, Agent, or Firm—W. Daniel Swayze, Jr.; W. James Brady; Frederick J. Telecky, Jr.

(57) ABSTRACT

A bias rail buffer circuit and method in accordance with the present invention overcomes many shortcomings of the prior art. A bias rail buffer circuit for providing a reference signal is suitably configured to absorb external disturbances appearing on an output reference signal. A method for absorbing the external disturbances appearing at the output reference signal suitably includes the use of complementary transistors to source current and sink current to said output reference signal, depending on whether the external disturbances are providing a decrease or an increase to the output reference signal. The bias rail buffer circuit suitably includes an input transistor, a first pair of complementary transistors and a second pair of complementary transistors, such that the second pair of complementary transistors operate to source current and sink current to absorb external disturbances imparted on said output reference signal.

12 Claims, 8 Drawing Sheets

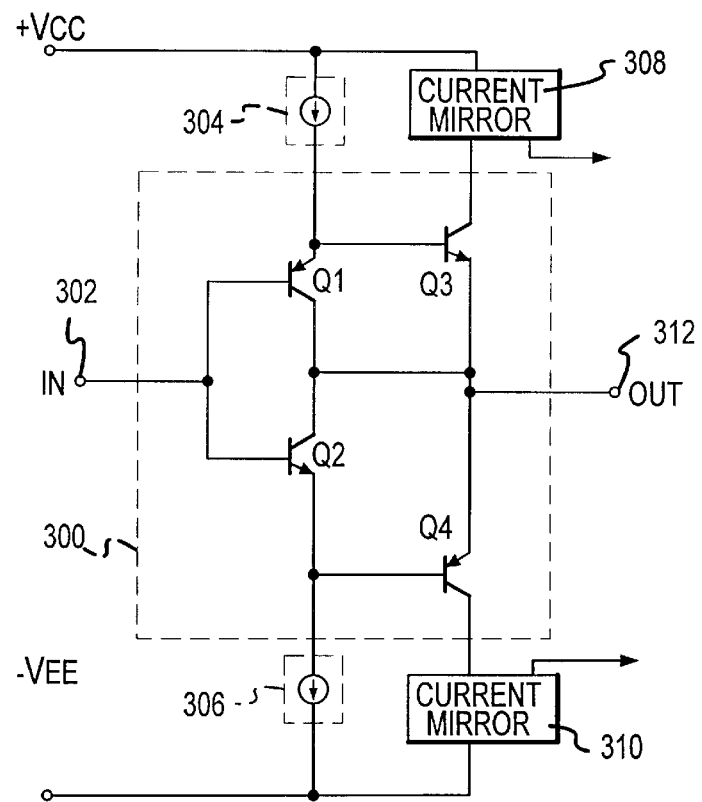
FIG.3
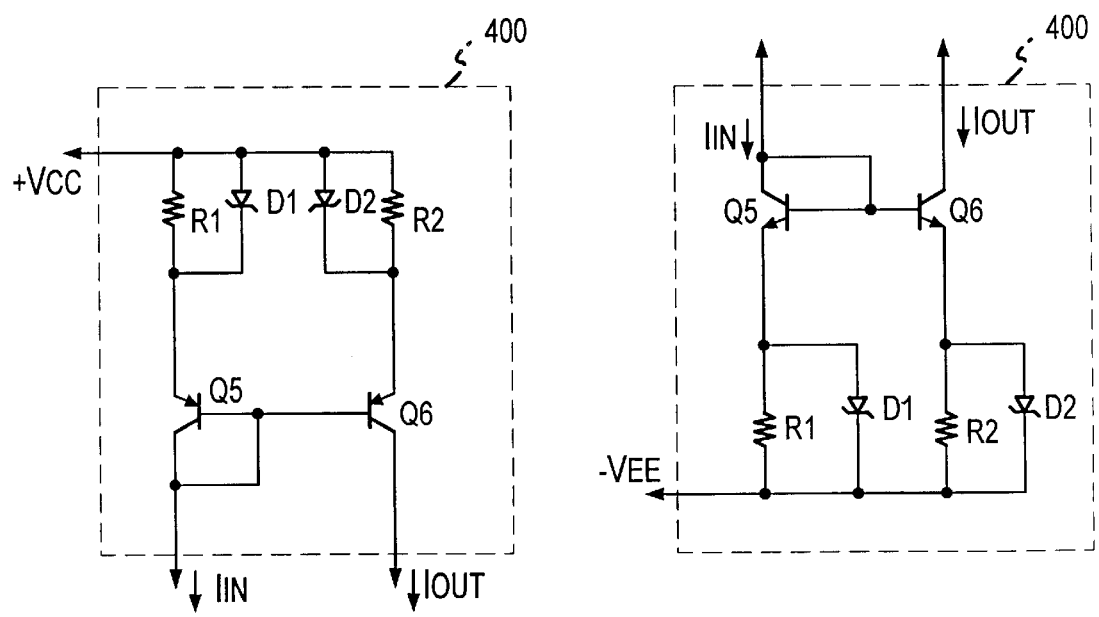
FIG.4A
FIG.4B

METHOD FOR BIAS RAIL BUFFERING

CROSS-REFERENCE TO RELATED APPLICATIONS

This is a continuation application based on pending U.S. patent application Ser. No. 09/692,017, filed Oct. 19, 2000, which was a continuation application based on U.S. patent application Ser. No. 09/215,402, filed Dec. 18, 1998, now U.S. Pat. No. 6,163,216, issued on Dec. 19, 2000, all of which are incorporated herein by reference.

FIELD OF THE INVENTION

The present invention relates to components for use in integrated circuits. More particularly, the present invention relates to an improved wideband operational amplifier suitable for providing a voltage or current feedback amplifier or a closed loop buffer.

BACKGROUND OF THE INVENTION

With the growing demand for cheaper, and yet more reliable integrated circuit components for use in communication, imaging and high-quality video applications continuing to increase, integrated circuit components, such as operational amplifiers, continue to improve at an ever-rapid pace. As a result, integrated circuit manufacturers are requiring more specialized, as well as more general purpose, integrated circuit components to meet the design requirements of a myriad of emerging applications.

With respect to integrated circuits in general, a problem complicating the design of integrated circuit components, such as operational amplifiers, is the introduction of undesirable disturbances, such as noise or ringing, from one part of the circuit component to another. Typically, these disturbances are imparted through various locations, including current and voltage references used the integrated circuit. With respect to operational amplifiers, these disturbances are generally imparted within the input and output stages, as well as the power supply rails.

For integrated circuits, many recent current sources have incorporated degeneration resistors between the supply rails and the current source's components, such as a current mirror's transistors, to provide the current source with a higher output resistance. Unfortunately, for a given voltage at the input or output terminals of an integrated circuit component, the increasing in value of the degeneration resistors tends to cause the circuit's components, such as the transistors in a current mirror, to saturate and thus cause the current source to eventually fail at higher currents. Further, these current sources, in general, can be configured to either sink or source current as needed, but have great difficulty, or can not provide altogether, both the sourcing and sinking of current as needed to substantially absorb external disturbances imparted onto the current source. Accordingly, these current sources tend to introduce the remaining noise and disturbances to the remaining components of the integrated circuit, such as an operational amplifier.

The demands for improvement in operational amplifiers exist in many areas, including operational amplifiers having lower input offset voltage, higher slew rates, higher voltage and current output while requiring lower supply current, lower input noise, and greater stability with regard to external disturbances such as ringing. While many recent operational amplifiers have been developed to provide a slew-boosted input stage, in general, these operational amplifiers tend to have a poorer common-mode input voltage range, lower output voltages, and/or lower output current at higher output voltage. Other recent operational amplifiers have provided a boosted output stage capable of delivering high output currents using lower supply currents, unfortunately, however, these operational amplifiers tend to suffer from deplorable crossover distortions, e.g., unacceptable 3rd harmonic distortions within the output stages.

An additional problem existing with operational amplifiers is input offset voltage. Input offset is generally the magnitude of the voltage that if applied to the input(s) of an operational amplifier would reduce to zero the output voltage of the operational amplifier. Typically, this offset voltage is a result of mismatches and internal biases, such as, for example, unequal PNP and NPN betas or impedance values, existing within the various components, e.g., transistors, capacitors and resistors, that comprise the operational amplifier. Accordingly, an input offset voltage can cause various problems in the application of the amplifier.

Further, with respect to operational amplifiers, many recent output stage circuits have began incorporating current feedback amplifiers configured as buffers in an attempt to provide an alternative to the use of conventional emitter/source followers. In general, the feedback resistor employed in these current feedback buffers is often configured to set the phase margin for the output stage circuit, i.e., determine the instability in the output circuit. Typically, if an amplifier possesses a phase margin of less than 180 degrees, the amplifier is stable. If on the other hand, the phase margin of an amplifier exceeds 180 degrees, the amplifier will tend to be unstable. By increasing the value of the feedback resistor, the phase margin of the output circuit can be improved, however, this increasing of the feedback resistor value has the disadvantage of reducing the bandwidth of the output stage circuit. Further, by reducing the bandwidth of the output stage circuit, the phase margin for the rest of the operational amplifier may be adversely affected.

Other attempts to improve the phase margin, and thus the stability, of an output stage have demonstrated some success, but disadvantages still exist with these newer implementations. For example, some operational amplifiers employ capacitors between the input node of an output stage and the supply rails. Unfortunately, due to parasitic inductances typically occurring in the supply rails, VCC and VEE, multiple feedback paths are created in the output stage, thus potentially leading to marginal stability and severe ringing.

Accordingly, as one will appreciate, a need exist for improved integrated circuit components capable of reducing the detrimental effects of noise introduced by external and internal components within an integrated circuit. Further, a need exist for an improved operational amplifier having a fast slew rate and configured to provide a high voltage and current output while solving the problem of package parasitics and multiple feedback paths within the amplifiers.

SUMMARY OF THE INVENTION

The integrated circuit components according to the present invention addresses many of the shortcomings of the prior art. In accordance with a preferred embodiment of the present invention, a wideband operational amplifier configured to provide a high output voltage and current comprises an input stage having a first input buffer, a. second input buffer and a bias rail buffer, and an output stage having an output buffer and a compensation circuit. Further, the first and second input buffers may include current mirrors suitably configured to facilitate a lower input offset voltage and lower input voltage noise. Additionally, the operational amplifier may provide wide common-mode input range and full power bandwidth simultaneously.

In accordance with another aspect of the present invention, a bias rail buffer comprising a buffer portion and a current source is suitably configured to provide a stable bias rail reference by sourcing and sinking current thus substantially eliminating the introduction of ringing or other external disturbances from one part of an integrated circuit component, such as an operational amplifier, to another.

In accordance with yet another aspect of the present invention, current mirrors configured to provide current sources to an integrated circuit component suitably provide more degeneration for lower noise and higher output resistance without increasing the minimum input and output voltages of the current mirrors.

In accordance with a further aspect of the present invention, a compensation circuit is configured to provide compensation for multiple feedback paths introduced by parasitic inductances, capacitances or resistances existing in the supply rails into an output stage buffer.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

FIG. 3 is a circuit diagram of a preferred embodiment of an input stage buffer as may be utilized in the operational amplifier shown in FIG. 2;

FIGS. 4A and 4B are circuit diagrams of preferred embodiments of current mirrors as may be utilized in an operational amplifier;

DETAILED DESCRIPTION

The present invention may be described herein in terms of various functional block components and various processing steps. It should be appreciated that such functional blocks may be realized by any number of hardware components configured to perform the specified functions. For example, the present invention may employ various integrated components, e.g., buffers, supply rail references, current mirrors, filters, and the like, comprised of various electrical devices, e.g., resistors, transistors, capacitors, diodes and the like whose values may be suitably configured for various intended purposes. In addition, the present invention may be practiced in any number of integrated circuits. Such general applications that may be appreciated by those skilled in the art in light of the present disclosure are not described in detail herein. However for purposes of illustration only, exemplary embodiments of the present invention will be described herein in connection with an operational amplifier.

Figure 1:
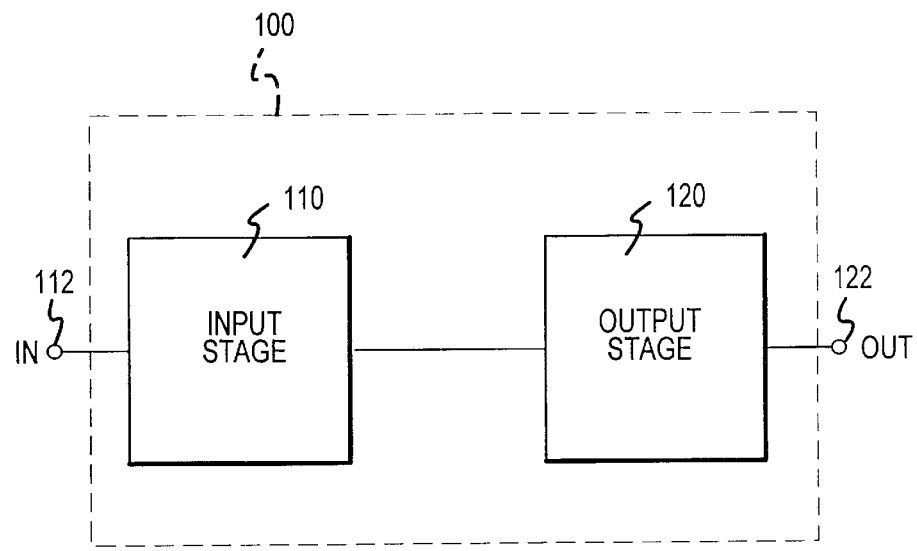
FIG. 1 is a schematic diagram of an integrated circuit, for example an operational amplifier in accordance with the present invention.

With reference to FIG. 1, an integrated circuit (e.g., an operational amplifier) 100 is suitably configured for a variety of applications, including, for example, single supply ADC input drivers, video line drivers, xDSL line drivers, PLL feedback integrators and differential receivers. In accordance with a preferred embodiment of the present invention, operational amplifier 100 suitably comprises an input stage 110 and an output stage 120. Preferably, input stage 110 includes an input terminal 112 configured to receive an input suitable for integration into various integrated circuits. Accordingly, input 112 may be configured to receive a voltage or current signal to facilitate the operation of input stage 110. Moreover, input stage 110 is suitably configured to provide a very high slew rate, e.g., greater than 2200 V/microsec, while preferably requiring a low power input.

In accordance with a preferred embodiment, input stage 110 is configured to provide a lower input offset voltage and minimal phase delay. Input stage 110 includes an input buffer. Preferably, input stage 110 includes two unity gain buffers. To provide a stable line reference, input stage preferably includes at least one buffer to compensate for ringing or other instabilities in the line reference. Preferably, current mirrors are provided and are coupled to power supply connections of the unity gain buffers to facilitate the correction of input voltage offset and the reduction of input voltage noise.

Output stage 120 is preferably configured to receive an output from input stage 110 and suitably provide an output 122 preferably having both a high output current and a high output voltage. Accordingly, output 122 is suitably configured to provide a voltage or current reference to an integrated circuit. Preferably, output stage 120 comprises a buffer amplifier configured to provide a stable high output current and voltage. Moreover, output stage 120 may further comprise a disable circuit to ensure that output stage 120, and thus output 122, turns off and remains off when desired. In accordance with an aspect of this embodiment of the present invention, output stage 120 comprises a compensation circuit suitably configured to substantially eliminate ringing introduced by the existence of parasitics, e.g., inductances, capacitances or resistances, appearing at the supply rails.

Figure 2:
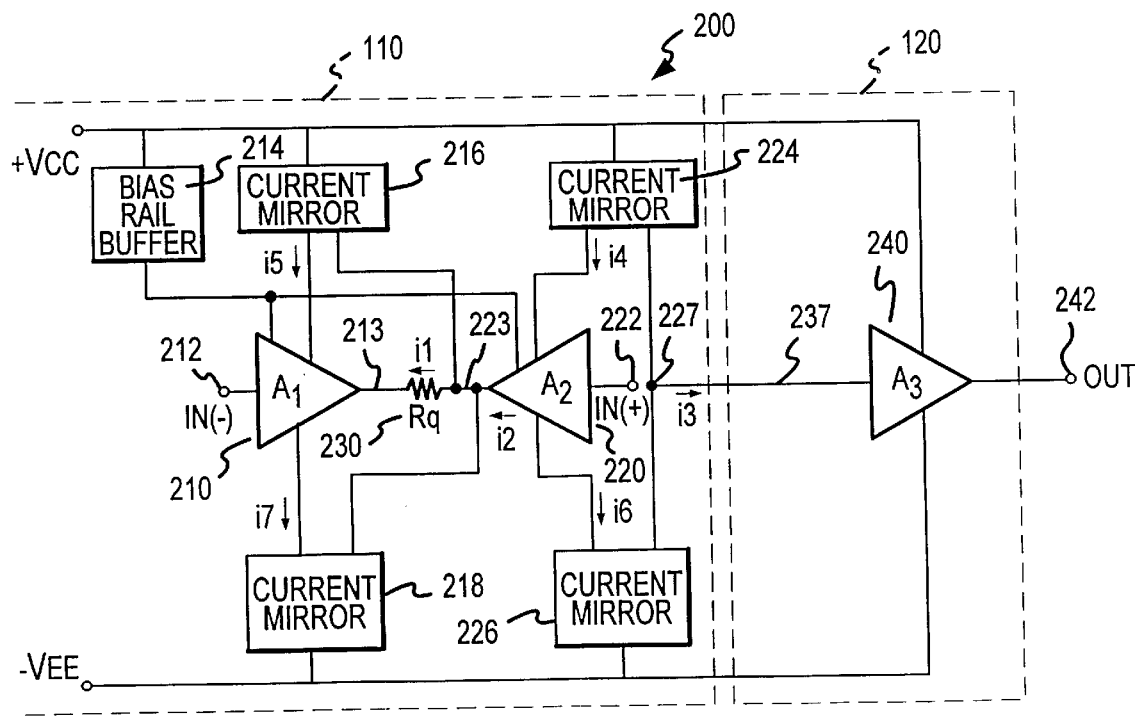
FIG. 2 is a schematic diagram of a preferred embodiment of the operational amplifier shown in FIG. 1.

Having generally provided an overview of operational amplifier 100 in accordance with the present invention, a description of various preferred embodiments will now be provided. With reference to FIG. 2, in accordance with one preferred embodiment, an operational amplifier 200 suitably comprises an input stage 110 and an output stage 120. Moreover, operational amplifier 100 suitably includes a connection to a positive supply voltage source, VCC, and a connection to a negative supply voltage source, VEE.

Accordingly, power supply rails VCC and VEE are configured to provide a power supply voltage to input stage 110 and output stage 120 during operation of amplifier 200.

In accordance with this embodiment, input stage 110 preferably comprises a first buffer 210(A1), a second buffer 220(A2) and a bias rail buffer 214. Preferably, input buffer 210 and input buffer 220 each comprise a unity gain buffer circuit suitably configured to provide little phase delay and have low power consumption requirements. Preferably, buffer 210 and buffer 220 each have an input terminal and an output terminal. Preferably, input buffer 210 has a negative input terminal 212, In(−), and an output terminal 213, while input buffer 220 has a positive input terminal 222, In(+), and an output terminal 223.

Figure 8:
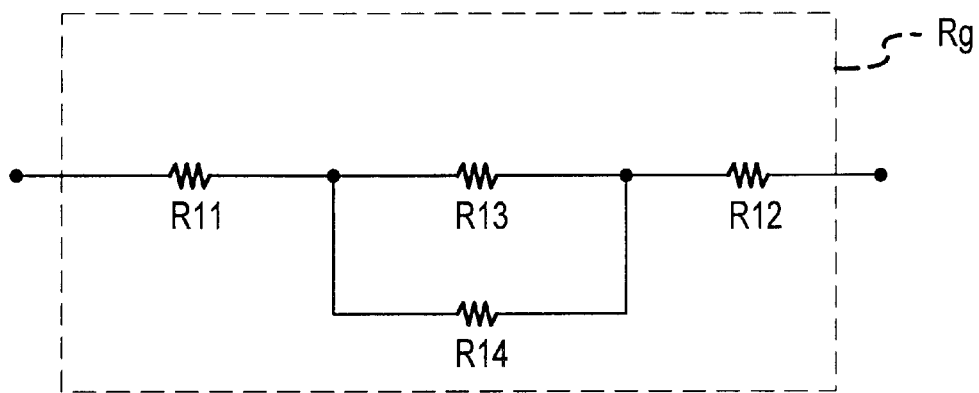
FIG. 8 is a circuit diagram of a feedback resistor as may be utilized in accordance with a preferred embodiment of an input stage.

Preferably, input stage 110 further comprises a resistor network, Rg, suitably configured to receive output currents from input buffer 210 and input buffer 220. Accordingly, with momentary reference to FIG. 8, resistor network Rg preferably comprises a combination of resistors, such as, for example, a combination in series, parallel or both. Alternatively, resistor network Rg may be comprised of a single resistor. Moreover, resistor network Rg is suitably configured for connection between output 213 of buffer 210 and output 223 of buffer 220.

Continuing with this preferred embodiment, bias rail buffer 214 is suitably configured to provide a stable reference to input stage 110, and thus buffers 210 and 220. Preferably, bias rail buffer 214 is configured to provide a stable reference with respect to various factors, including temperature changes and the influence of external disturbances, e.g., voltage/current spikes or noise.

In accordance with this preferred embodiment, bias rail buffer 214 is configured in a push-pull manner, i.e., configured to both source and sink current as appropriate to provide a conductive path for undesirable currents. Moreover, bias rail buffer 214 further comprises a current source configured to provide a current reference to input buffer 210 and input buffer 220. Preferably, bias rail buffer 214 drives a plurality of parallel current sources configured to provide current references throughout input stage 110 and, if desired, output stage 120.

In accordance with a preferred embodiment, input stage 110 may further include a plurality of current mirrors configured to provide a lower input offset voltage and lower voltage noise while providing a high slew rate. For example, preferably input stage 110 includes respective current mirrors, 216 and 218, preferably configured for unity gain and further coupled to input buffer 210. Moreover, input stage 110 further includes respective current mirrors, 224 and 226, suitably coupled to input buffer 220. Preferably, an input of current mirror 216 and an input of current mirror 218 are coupled to power supply terminals of input buffer 210 while an output of current mirror 216 and an output of current mirror 218 are coupled to output 223 of input buffer 220. Accordingly, as will be described in more detail below, current mirrors 216 and 218 are suitably configured to substantially reduce the input offset voltage present in operational amplifier 200. Further, an input of current mirror 224 and an input of current mirror 226 are coupled to input buffer 220 while an output of current mirror 224 and an output of current mirror 226 are coupled to output stage 120.

Continuing in accordance with this preferred embodiment, output stage 120 preferably comprises a third buffer 240(A3). Buffer 240 preferably includes an input 239 and an output 242. Preferably, input 239 is configured to receive an output of current mirror 224 and an output of current mirror 226. Accordingly, buffer 240 is suitably configured to supply high output current and high output voltage, i.e., while providing a high output voltage, buffer 240 can also deliver required high currents of an integrated circuit. Moreover, buffer 240 is suitably configured to maintain a high slew rate. Preferably, buffer 240 comprises a current feedback amplifier configured as a buffer.

In accordance with a preferred embodiment, output stage 120 further comprises a compensation circuit suitably configured to substantially eliminate ringing introduced by the existence of parasitics, e.g., inductances, capacitances or resistances, appearing at the supply rails, VCC and VEE. Preferably, output stage 120 comprises a compensation capacitor suitably coupled to input 239 of buffer 240 and to the supply rails. Accordingly, this compensation circuit of output stage 120 is suitably configured to capacitively couple any So ringing occurring at the supply rails, and subtract out any distortions created, to stabilize output 242 of buffer 240.

In accordance with various other aspects of this preferred embodiment, output stage 120 further comprises a disable circuit to ensure that output stage 120, and thus output 242, turns off and remains off when requested. In accordance with the aspects of this embodiment, output stage 120 preferably comprises a plurality of resistors to provide a discharge path for undesirable signals.

Having described one preferred embodiment of operational amplifier 200, a further detailed description of the operation of amplifier 200 will now be provided. With reference to FIG. 2, bias rail buffer 214 preferably provides a stable reference to input buffers 210 and 220. Preferably, a differential input voltage will be applied at input terminals In(−) 212 and In(+) 222. Accordingly, the differential input voltage will be acted upon by unity gain buffers 210 and 220. Upon the operation of buffers 210 and 220, output 213 of buffer 210 and output 223 of buffer 220 will impress a current, i1, across resistor network Rg. As a result of the unity gain of current mirrors 216 and 218, a current i2 will be approximately twice the current i1. This resulting current in Rg will preferably appear in the power supply connections of buffer 220. Currents, i4 and i6, appearing at buffer 220 will be mirrored by current mirrors 224 and 226 and delivered as current i3 to input 239 of output buffer 240. With a compensation circuit acting upon any distortions created by parasitics appearing at supply rails VCC and VEE, the resulting input voltage will be suitably buffered by output buffer 240 and delivered to output 242. As a result, output 242 is suitably configured to provide a high output voltage and a high output current.

Having now described a preferred embodiment of operational amplifier 200 and its operation, a detailed description of various other aspects of the present invention will now be provided. As discussed above, input stage 110 preferably comprises input buffers 210 and 220. Preferably, input buffers 210 and 220 are unity gain buffers. With momentary reference to FIG. 3, in accordance with a particularly preferred embodiment, an input buffer 300, such as may be utilized as input buffers 210 and 220, is shown. In accordance with this embodiment, input buffer 300 preferably comprises an input terminal 302 and an output terminal 312. Accordingly, input terminal 302 may be suitably configured as a negative input terminal, such as, for example, In(−) 212, or may be suitably configured as a positive input terminal, such as, for example, In(+) 222. Moreover, when buffer 300 is suitably configured as input buffers 210 and 220, a differential input voltage may be applied across input terminals 212 and 222.

In accordance with this embodiment, input terminal 302 is collectively connected to the bases of transistors Q1 and Q2. Preferably, transistor Q1 comprises a PNP-type transistor and transistor Q2 comprises an NPN-type transistor. Moreover, the emitters of Q1 and Q2 are preferably connected to current references 304 and 306, respectively. Further, the collectors of Q1 and Q2 are collectively connected to output terminal 312.

Buffer 300 further comprises a pair of complementary transistors Q3 and Q4. Preferably, transistor Q3 comprises an NPN-type transistor and transistor Q4 comprises an PNP-type transistor. Moreover, the collectors of transistors Q3 and Q4 are preferably configured as the power supply connections of buffer 300. In accordance with the preferred embodiment, the base of Q3 is connected to the emitter of Q1 while the base of Q4 is connected to the emitter of Q2. Moreover, the emitters of Q3 and Q4 are collectively connected to the collectors of Q1 and Q2, and thus to output terminal 312. Accordingly, transistors Q1, Q2, Q3 and Q4 are suitably configured to provide buffer 300 with a unity gain at output 312.

In accordance with a particularly preferred aspect of this embodiment, collectors of Q3 and Q4 are connected to respective current mirrors 308 and 310. Preferably, the collector of Q3 is connected to current mirror 308 and the collector of Q4 is connected to current mirror 310. Accordingly, transistors Q3 and Q4 tend to operate more efficiently when current mirror 308 and current mirror 310 are configured to reduce the likelihood of saturation for each transistor Q3 and Q4.

As discussed above and again with reference to FIG. 2, input stage 110 preferably includes a bias rail buffer 214 suitably configured to provide a stable line reference to input stage 110, and thus buffers 210 and 220. Further, bias rail buffer 214 is preferably configured in a push-pull manner, i.e., configured to both source and sink current as appropriate to provide a conductive path for undesirable currents.

Figure 5A:
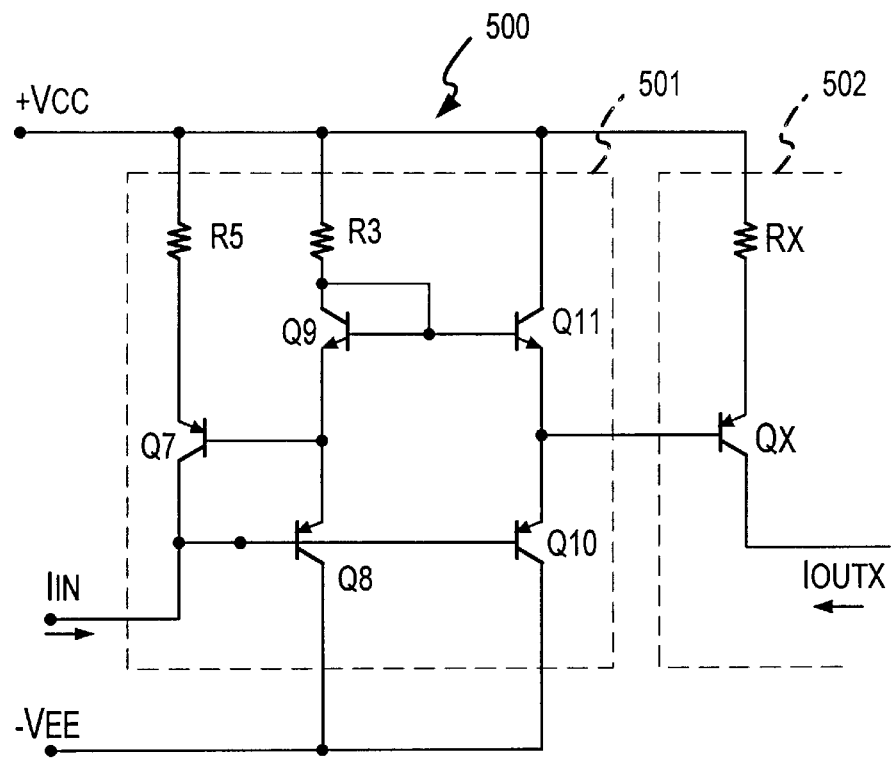
FIGS. 5A and 5B are circuit diagrams of preferred embodiments of bias rail buffers as may be utilized in an operational amplifier.

With momentary reference to FIG. 5A, in accordance with a particularly preferred aspect of this embodiment, a bias rail buffer 500, such as can be implemented as bias rail buffer 214, is shown. In accordance with this embodiment, bias rail buffer 500 suitably includes a buffer portion 501 and a current source portion 502. Buffer portion 501 preferably includes an input source, IIN, operatively connected to supply rail VCC, and an input transistor Q7. Preferably, the collector of transistor Q7 is configured to receive input source, IIN, while the emitter of Q7 is connected to supply rail VCC through a biasing resistor R5. Preferably, buffer portion 501 further comprises a pair of complementary transistors Q8 and Q9. Preferably, the emitters of Q8 and Q9 are collectively connected to the base of Q7. Further, the collector of Q8 is preferably connected to supply rail VEE, while the collector of Q9 is preferably connected to supply rail VCC through a resistor R3.

Preferably, buffer portion 501 further comprises a complementary pair of transistors, Q10 and Q11. Preferably, the bases of Q8 and Q10 are collectively connected to the collector of Q7, and thus to input source IIN. Moreover, the bases of Q9 and Q11 are collectively connected to the collector of Q9, and thus to supply rail VCC through resistor R3. Accordingly, by shorting the base of Q9 to its collector, Q9 may have the characteristics of a diode. Further, the collectors of Q10 and Q11 are preferably connected to supply rails, VEE and VCC, respectively.

In accordance with this embodiment, current source portion 502 preferably comprises an output, IOUTx, and a transistor QX with a resistor RX. Preferably, the collector of QX is connected to the output current sources 502 while the base of QX is collectively connected to the emitters of Q10 and Q11. Further, the emitter of Qx is coupled to a supply rail through resistor Rx. In accordance with one embodiment, Qx may comprise an PNP transistor (as shown) and Rx is connected to supply rail, VCC. In accordance with another embodiment, with reference to FIG. 5B, Qx may comprise a NPN transistor and Rx may be suitably connected to supply rail, VEE.

In accordance with the preferred embodiment, bias rail buffer 500 is suitably configured to provide a stable line reference to input stage 110 over time, temperature and, preferably, against the influence of external disturbances. During the operation of an integrated circuit, external disturbances, such as, for example, voltage or current fluctuating or ringing, may occur throughout the circuit and become imparted onto bias rails, and thus the bases of multiple transistors Qx. Accordingly, these disturbances can cause instability in an integrated circuit. With reference to FIG. 5A, external disturbances, such as voltage or current fluctuations, may be imparted onto output terminal, Ioutx. Due to the existence of a parasitic capacitance across the collector junction of transistor Qx, i.e., between the collector and base of transistor Qx, any external disturbances imparted onto output terminal Ioutx will appear on the base of transistor Qx as a ringing-like disturbance or as voltage/current spikes.

In accordance with the preferred embodiment, with reference to FIG. 5A, as voltage ringing or spikes occur at the collector of Qx, the base voltage will tend to increase or decrease approximately by the magnitude of ringing or the spikes. Accordingly, as the voltage at the base of Qx is decreased, i.e., the base is pulled down, transistor Q11 will source current into the base of Qx and the external disturbances will be rapidly absorbed. On the other hand, as the voltage at the base of Qx is increased, i.e., the base is pushed up, transistor Q10 will sink current from the base of Qx and the external disturbances will be rapidly absorbed. Accordingly, external disturbances and transients imparted onto bias rail buffer 500 will be provided with a conductive path and suitably absorbed, thus leading to a stable supply reference for input stage 110, i.e., stable current sources for input buffers 210 and 220.

Figure 6A:
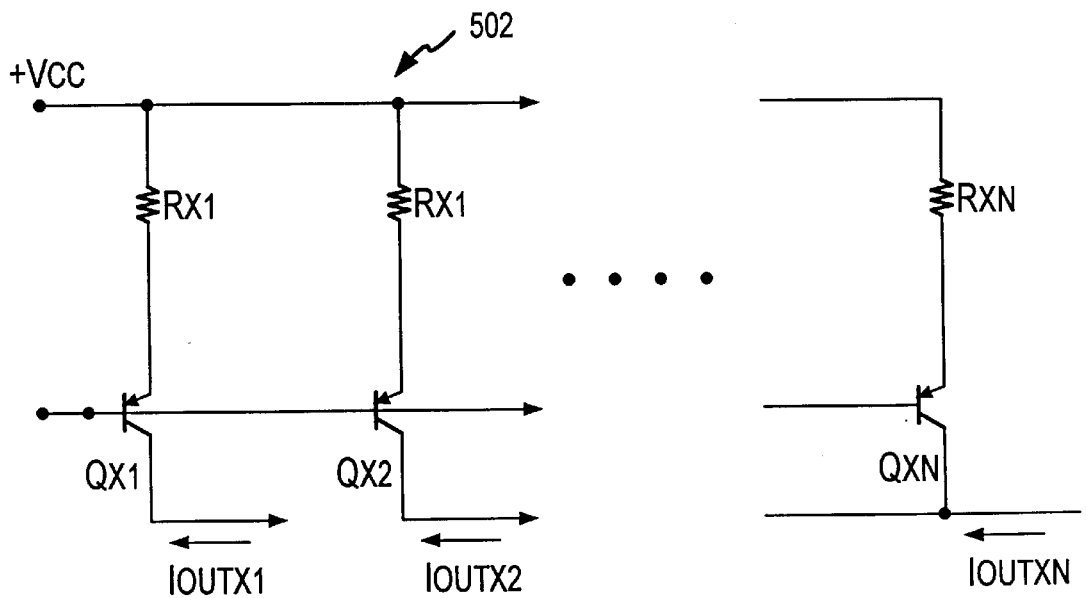
FIGS. 6A and 6B are circuit diagrams of preferred embodiments of current sources as may be utilized in an operational amplifier.

Continuing in accordance with a preferred embodiment, current source portion 502 may comprise a series of transistors Qx and resistors Rx. With momentary reference to FIG. 6A, current source portion 502 comprises a first transistor QX1 and at least a second transistor QX2. In accordance with this preferred embodiment, the bases of transistors QX1 and QX2 are collectively connected. Further, the emitters of QX1 and QX2 are connected, through resistors RX1 and RX2 respectively, to a supply rail such as VCC or VEE, depending on the characteristics of the transistors QX1 and QX2, i.e., depending on whether an PNP or NPN-type transistor. Moreover, current source portion 502 may suitably comprise multiple current sources comprises of transistors QX1, QX2, . . . QXN and resistors RX1, RX2, . . . RXN. Accordingly, each current source, i.e., each Qx and Rx pair, may provide a suitable current reference to an input buffer.

Figure 5B:
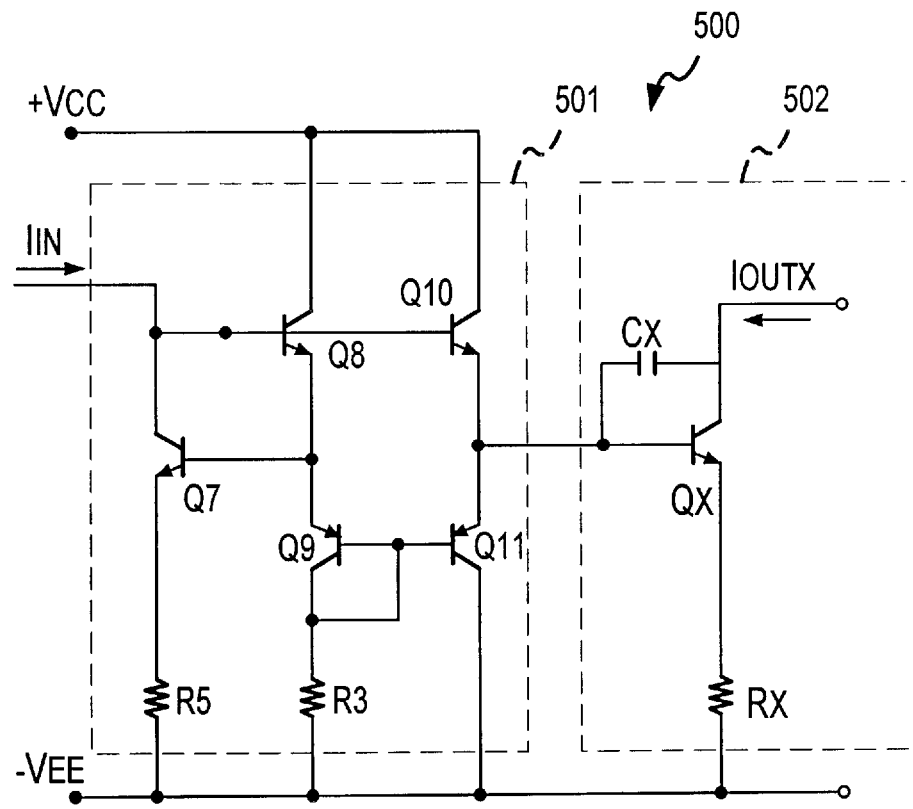
Figure 6B:
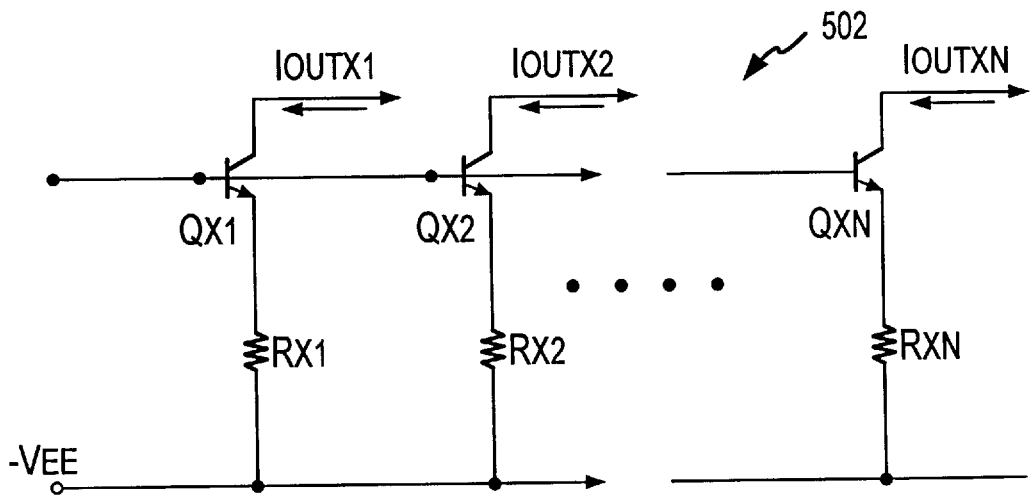

With reference to FIGS. 5B and 6B, the various components comprising buffer portion 500 may suitably be configured to change positions and orientation as shown, e.g., from a PNP-type transistor to an NPN-type transistor or from a NPN-type transistor to an PNP-type transistor, without departing from the scope of the present invention.

In accordance with a most preferred embodiment, with momentary reference to FIG. 3, current source portions 502, comprising QXN and RXN, may provide current sources for a buffer 300, such as, for example, current references 304 and 306. Accordingly, input buffers 210 and 220 preferably utilize current source portions 502 to supply the current references used during their operation.

As discussed above in FIG. 2, input stage 110 preferably includes a plurality of current mirrors configured to facilitate the providing of a lower input offset voltage and lower voltage noise while providing a high slew rate. With momentary reference to FIG. 4, a preferred embodiment of a current mirror 400 is shown. Current mirror 400 includes a current mirror configuration comprising transistors Q5 and Q6, with the bases of Q5 and Q6 connected together, and the base of Q5 being further connected, i.e., shorted, to its collector. Further, the collector of Q5 is connected to the input, Iin, of current mirror 400 while the collector of Q6 is connected to the output, Iout, of current mirror 400. In accordance with a preferred embodiment, the gain of current mirror 400 is unity.

In accordance with a preferred embodiment, current mirror 400 further comprises a pair of degeneration resistors, R1 and R2. Preferably, R1 is connected between the emitter of Q5 and a supply rail, VCC and VEE, while R2 is connected between the emitter of Q6 and a supply rail. Accordingly, degeneration resistors R1 and R2 are preferably configured with high values, preferably between 400 and 500 ohms, to facilitate the providing of a low equivalent input voltage noise, such as the input voltage noise that may occur in input stage 110. In other words, the occurrence of random currents and voltages, such as may occur in input stage 110, are subsequently divided down by degeneration resistors R1 and R2. Accordingly, by making the resistance values of degeneration resistors R1 and R2 higher, the input voltage noise will be comparably reduced.

However, for a large current signal Iin, the voltage at R1 will tend to increase by a large factor. Further, during slewing conditions of an input stage, such as, for example, input stage 110, the current in current mirror 400 may increase by a factor of 10 or more. Accordingly, the use of large resistance values for degeneration resistors R1 and R2 may tend to cause current mirror 400 to saturate, i.e., the presence of a high voltage in transistors Q5 and Q6 will tend to cause the transistors to become saturated.

In accordance with a preferred embodiment, current mirror 400 further comprises a pair of diodes, D1 and D2, suitably connected in parallel with degeneration resistors R1 and R2, i.e., diode D1 is preferably connected to the emitter of Q5 and to a supply rail while diode D2 is preferably connected to the emitter of Q6 and a supply rail. In accordance with this embodiment, diodes D1 and D2 may comprise any type of diode or diode configuration. In accordance with a particularly preferred embodiment, diodes D1 and D2 are suitably configured as Schottky-type diodes.

Accordingly, under quiescent operating conditions, i.e., under low current conditions, diodes D1 and D2 will preferably be turned off. However, under large signal conditions, such as during slewing of current mirror 400, diodes D1 and D2 will preferably turn on and effectively clamp the emitter voltages of transistors Q5 and Q6 and thus prevent saturation of current mirror 400. Accordingly, current mirror 400 is suitably configured to provide for low voltage noise conditions at the input of buffer 210 and 220 while avoiding saturation due to large degeneration resistor values.

In accordance with a particularly preferred embodiment, diode D2 is suitably configured to be larger in size than diode D1. In accordance with this embodiment, diodes D1 and D2 are suitably configured such that the parasitic capacitances present on diodes D1 and D2 facilitate a high slew rate. In other words, the parasitic capacitances of diodes D1 and D2 are preferably imbalanced such that transistor Q6 will tend to pull more current than transistor Q5, thus tending to improve the slewing characteristics of current mirror 400. Accordingly, to facilitate a faster slew rate, diode D2 is preferably configured to be larger in size than diode D1. Preferably, diode D2 is configured to be at least twice the size of diode D1. Thus, in accordance with this particularly preferred embodiment, current mirror 400 is suitably configured to facilitate the providing of a low input voltage noise while avoiding saturation and is suitably configured to provide a high slew rate.

In accordance with a preferred embodiment, current mirror may be suitably deployed within input stage 110. With reference to FIGS. 2 and 3, and continued reference to FIG. 4, a current mirror 400 may be suitably configured with buffer 300, such as, for example, as current mirrors 308 or 310, or may be suitably configured with input stage 110, such as, for example, as current mirrors 216, 218, 224 or 226. Accordingly, the input of current mirror 400, i.e., the collector of transistor Q5, may be suitably connected to the collector of transistor Q3 of buffer 300, e.g., when current mirror 400 is configured as current mirror 308 (as shown in FIG. 4A), or to the collector of transistor Q4 of buffer 300, e.g., when current mirror 400 is configured as current mirror 310 (as shown in FIG. 4B). Further, the output of current mirror 400, i.e., the collector of transistor Q6, may be suitably connected to output terminal 223 of input buffer 220, e.g., when current mirror 400 is configured as current mirror 216. Still further, the output of current mirror 400 may be suitably connected to input terminal 239 of output buffer 240, e.g., when current mirror 400 is configured as current mirror 216.

With reference to FIG. 4A, transistors Q5 and Q6 preferably comprise PNP-type transistors when current mirror 400 is configured as current mirror 308, or as current mirrors 216 or 224, and, with reference to FIG. 4B, preferably comprise NPN-type transistors when current mirror 400 is configured as current mirror 310, or as current mirrors 218 or 226.

As discussed above, in accordance with a preferred embodiment, with reference to FIG. 2, input stage 110 is suitably configured to provide operational amplifier 200 with a lower input offset voltage. Due to various mismatches, such as, for example, unequal NPN and PNP betas or uneven impedance values, that may exist with various components, e.g., transistors, diodes, capacitors and resistors, utilized in operational amplifier 200, output offset voltage may occur at output 242. However, in accordance with a preferred embodiment, current mirrors 216 and 218 are suitably configured such that their outputs, i.e., the collector of transistor Q6 of current mirror 400, are collectively connected to the output of input buffer 220(A2). Preferably, by "referring back" the outputs of current mirrors 216 and 218, offset errors present in operational amplifier 200, such as occurring in buffers 210 and 220, for example, will be substantially reduced. Accordingly, by reducing the offset errors present, amount of input offset voltage preferably needed to reduce these offset errors will be substantially reduced.

As described above, in accordance with a preferred embodiment, output stage 120 comprises a third buffer 240(A3) suitably configured to supply high output current and high output voltage, i.e., while providing a high output voltage, buffer 240 can also deliver any high currents required by the output load of buffer 240. Moreover, buffer 240 is suitably configured to maintain a high slew rate. Preferably, buffer 240 comprises a current feedback amplifier configured as a buffer.

Figure 7:
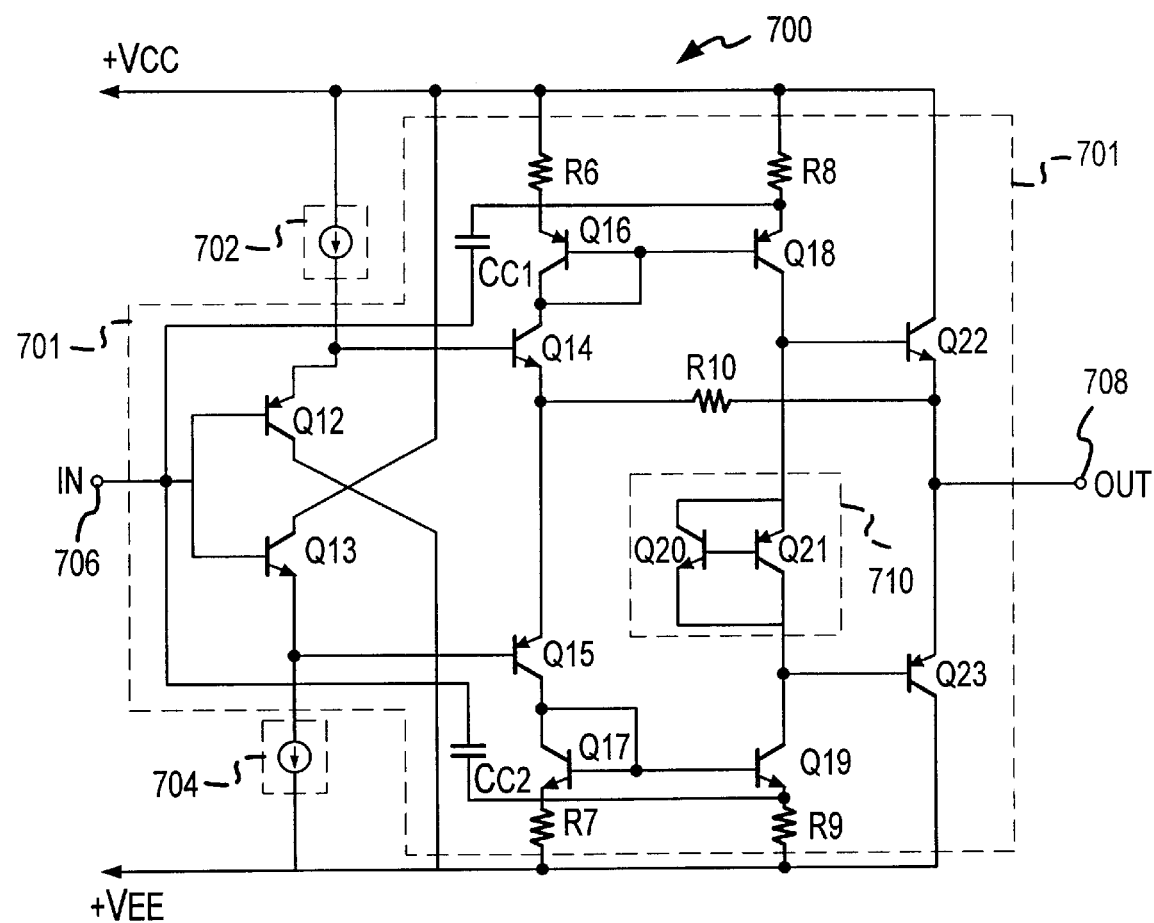
FIG. 7 is a circuit diagram of a preferred embodiment of an output stage as may be utilized in an operational amplifier.
Figure 7A:
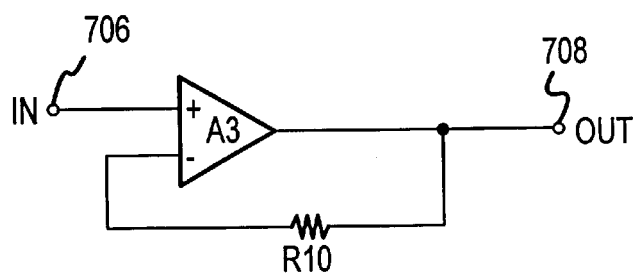
FIG. 7A is a schematic diagram of a preferred embodiment of a buffer as may be utilized in an output stage as shown in FIG. 7.

With reference now to FIG. 7, in accordance with a particularly preferred embodiment, an output stage 700, such as may be utilized as output stage 120, is shown. In accordance with this embodiment, output stage 700 preferably comprises an output buffer 701. Buffer 701 preferably includes an input 706 and an output 708. Moreover, buffer 701 preferably comprises a current feedback amplifier configured as a buffer. In accordance with this aspect, buffer 701 includes a feedback resistor, R10. With momentary reference to FIG. 7A, an exemplary current feedback amplifier configuration, in accordance with a preferred embodiment, is shown.

In accordance with this preferred embodiment, output buffer 701 comprises a pair of transistors, Q12 and Q13. Input 706 is collectively connected to the bases of transistors Q12 and Q13. Transistor Q12 preferably comprises a PNP-type transistor and transistor Q13 comprises an NPN-type transistor. Moreover, the emitters of Q12 and Q13 are preferably connected to current references 702 and 704, respectively. Preferably, output buffer 701 further comprises a complementary pair of transistors Q14 and Q15.

In accordance with the preferred embodiment, transistors Q12, Q13, Q14 and Q15 are suitably arranged in a diamond-like configuration, i.e., the collector of Q13 is connected to positive supply rail VCC and the collector of Q12 is connected to negative supply rail VEE. Further, the base of Q14 is preferably connected to the emitter of Q12 while the base of Q15 is preferably connected to the emitter of Q13. Additionally, the emitter of Q14 and Q15 are collectively connected. Preferably, the emitters of transistor Q14 and Q15 are collectively connected to output 708 through feedback resistor R10. Accordingly, transistors Q12 and Q13 may function as emitter followers, driving followers Q14 and Q15.

In accordance with this preferred embodiment, output buffer 701 further comprises a third pair of transistors, Q16 and Q18, and a fourth pair of transistors, Q17 and Q19. Preferably, each pair of transistors are suitably arranged in a current mirror-type configuration. In accordance with this aspect, the bases of transistors Q16 and Q18 are collectively connected to the collector of Q16 while the bases of transistors Q17 and Q19 are collectively connected to the collector of Q17. Preferably, the collector and base of Q16 are connected to the collector of Q14 while the collector and base of Q17 are connected to the collector of Q15. Further, the emitters of Q16 and Q18 are connected to supply rail Vcc through degeneration resistors R6 and R8, respectively, while the emitters of Q17 and Q19 are connected to supply rail VEE through degeneration resistors R7 and R9, respectively. Preferably emitter resistors R6–R9 are configured to further increase the output resistance of the current mirrors and reduce the effects of mismatch, e.g., unequal betas, between the collectors of Q16 and Q18 and the collectors of Q17 an Q19.

In accordance with this preferred embodiment, output buffer 701 further comprises a pair of complementary pair of transistors, Q22 and Q23. Preferably, transistors Q22 and Q23 are suitably configured as output transistors. In accordance with a preferred embodiment, the bases of transistor Q22 and Q23 and the collectors of Q18 and Q19 are collectively connected together. Accordingly, the operation of output buffer 701 may be as explained below. As an increase in input voltage is applied to input 706, the base voltage of transistor Q14 will increase, and a proportional increase in the collector current of Q14 will occur. Since the collector of Q14 is connected to the input of a current mirror, i.e., the collector of Q16 of the current mirror comprising Q16 and Q18, a proportional increase in current of the output of the current mirror will result, i.e., the collector current of Q18 will increase accordingly.

Further, as the increase in input voltage is applied to input 706, the base voltage of transistor Q15 will increase, and a proportional decrease in the collector current of Q15 will occur. Since the collector of Q15 is connected to the input of a current mirror, i.e., the collector of Q17 of the current mirror comprising transistors Q17 and Q19, a proportional decrease in current of the output of the current mirror will result, i.e., the collector current of Q19 will decrease accordingly. As a result of the increasing of collector current Q18 and the decreasing in collector current of Q19, the base voltages of transistors Q22 and Q23 will be increased. Accordingly, a proportional increase will appear at output 708.

In accordance with a particularly preferred embodiment, output buffer 701 may further include an output biasing circuit 710. In accordance with this embodiment, output biasing circuit comprises a pair of transistors, Q20 and Q21, suitably configured such that the bases of the transistors are connected while the collector of Q20 is connected to the emitter of Q21 and the collector of Q21 is connected to the emitter of Q20. Accordingly, transistors Q20 and Q21 may behave as diodes. Further, the collector of Q20 and the emitter of Q21 are collectively connected to the base of Q22 and the collector of Q18 while the collector of Q21 and the emitter of Q20 are collectively connected to the base of Q23 and the collector of Q19. In accordance with this aspect, circuit 710 is suitably configured to pull down the bias nodes of output transistors Q22 and Q23 upon disabling of output stage 700. For a more detailed explanation of the operation of circuit 710, please refer to U.S. Pat. No. 4,945,259, issued to Anderson on Jul. 31, 1990 and assigned to Applicant, and entitled, "Bias Voltage Generator and Method." Alternatively, circuit 710 may be replaced with a pair of diodes suitably configured to pull down the bias nodes of output transistors Q22 and Q23 without departing from the scope of the present invention.

Figures 9A, 9B:
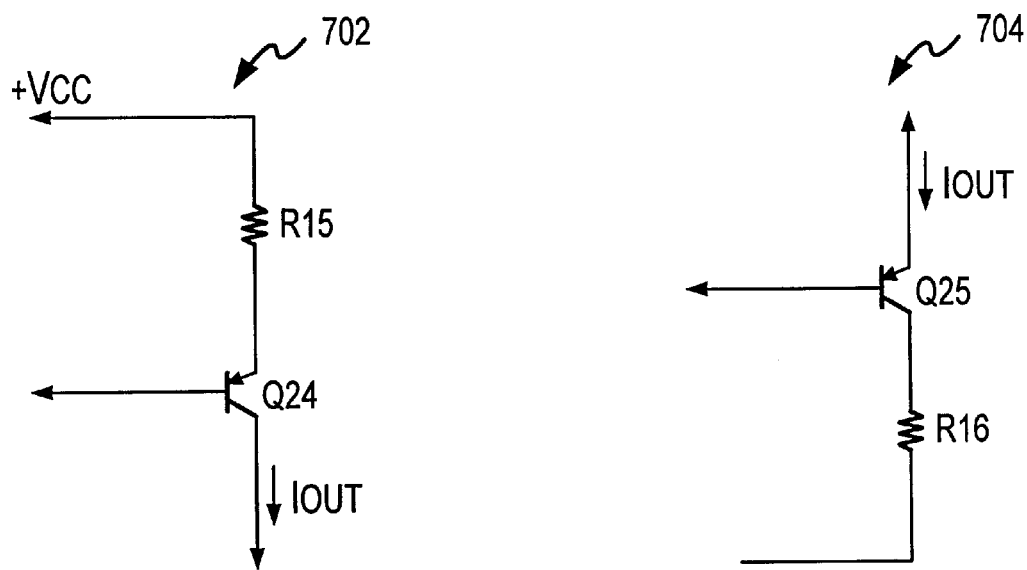
FIGS. 9A and 9B are circuit diagrams of current sources as may be utilized in an operational amplifier.

In accordance with a preferred embodiment, output stage 700 further comprises a pair of current sources 702 and 704. Accordingly, current sources 702 and 704 may be suitably provided by bias rail buffer 214. In accordance with a particularly preferred embodiment, current sources 702 and 704 are suitably provided from input stage current mirrors 224 and 226, respectively. In accordance with this embodiment, with reference to FIGS. 9A and 9B, current source 702 comprises a transistor Q24 while current source 704 comprises a transistor Q25. Preferably, the collector of Q24 is connected to supply rail VCC through a resistor R15 while the collector of transistor Q25 is connected to supply rail VEE through a resistor R16. Further, in accordance with this preferred embodiment, for current source 702, the base of transistor Q24 is connected to the output of current mirror 224. Further, for current source 704, the base of transistor Q25 is connected to the output of current mirror 226. Accordingly, as input stage 110 operates to pull output 237 high or low, i.e., the output of current mirrors 224 and 226, current sources 702 and 704 will attempt to do the same. Accordingly, this preferred embodiment suitably provides additional slew boost to output stage 700.

In accordance with a preferred embodiment of the present invention, output stage 700 further comprises a compensation circuit to facilitate the reduction of ringing or other like disturbances introduced within output stage 700 and thus improve the stability of the operational amplifier. As discussed above, due to parasitics, e.g., inductances, capacitances and resistances, existing at the supply rails VCC and VEE, multiple feedback paths capable of introducing severe ringing into an output stage can cause an output stage circuit to become unstable. This external disturbance or ringing can be introduced from the supply rails when current is required from output 708. For example, as the output current at output 708 is increased, transistor Q22 will tend to draw current from supply rail VCC to provide the needed current. Alternatively, as the output current at output 708 is decreased, transistor Q23 will tend to draw current from supply rail VEE to provide the needed current. However, this drawing of current by transistors Q22 and Q23 in conjunction with parasitics in supply rails has a tendency to introduce an unwanted signal onto the bases of transistors Q18 and Q19, which ultimately may lead to instability within output stage 700.

In accordance with the preferred embodiment, the compensation circuit of output stage 700 is suitably implemented to eliminate the potentially detrimental effects caused by the parasitics in supply rails VCC and VEE. Accordingly, output stage 700 preferably includes a pair of compensating capacitors, CC1 and CC2, suitably configured to substantially eliminate the unwanted signals imparted by bias rails VCC and VEE. In accordance with this aspect, capacitor CC1 is connected between the current mirror configuration of transistors Q16 and Q18 and input terminal 706. Preferably, capacitor CC1 is suitably connected between the emitter of transistor Q18 and input terminal 706. Likewise, capacitor CC2 is connected between the current mirror configuration of transistors Q17 and Q19 and input terminal 706. Preferably, capacitor CC2 is suitably connected between the emitter of transistor Q19 and input terminal 706. Moreover, the compensation circuit of output stage 700 may comprise additional capacitors (not shown) similarly configured to provide compensation for multiple feedback paths introduced by parasitics existing in the supply rails.

In accordance with this preferred embodiment, capacitor CC1 may comprise a single capacitor, such as, for example, a 1 pf capacitor, or a combination of capacitors in series, parallel or both. Likewise, capacitor CC2 may comprise a single capacitor, such as, for example, a 1 pf capacitor, or a combination of capacitors in series, parallel or both. Accordingly, capacitors CC1 and CC2 are suitably selected to provide a "pole-zero" compensation to output stage 700, thus providing compensation for multiple feedback paths introduced by parasitics existing in the supply rails.

Figure 11:
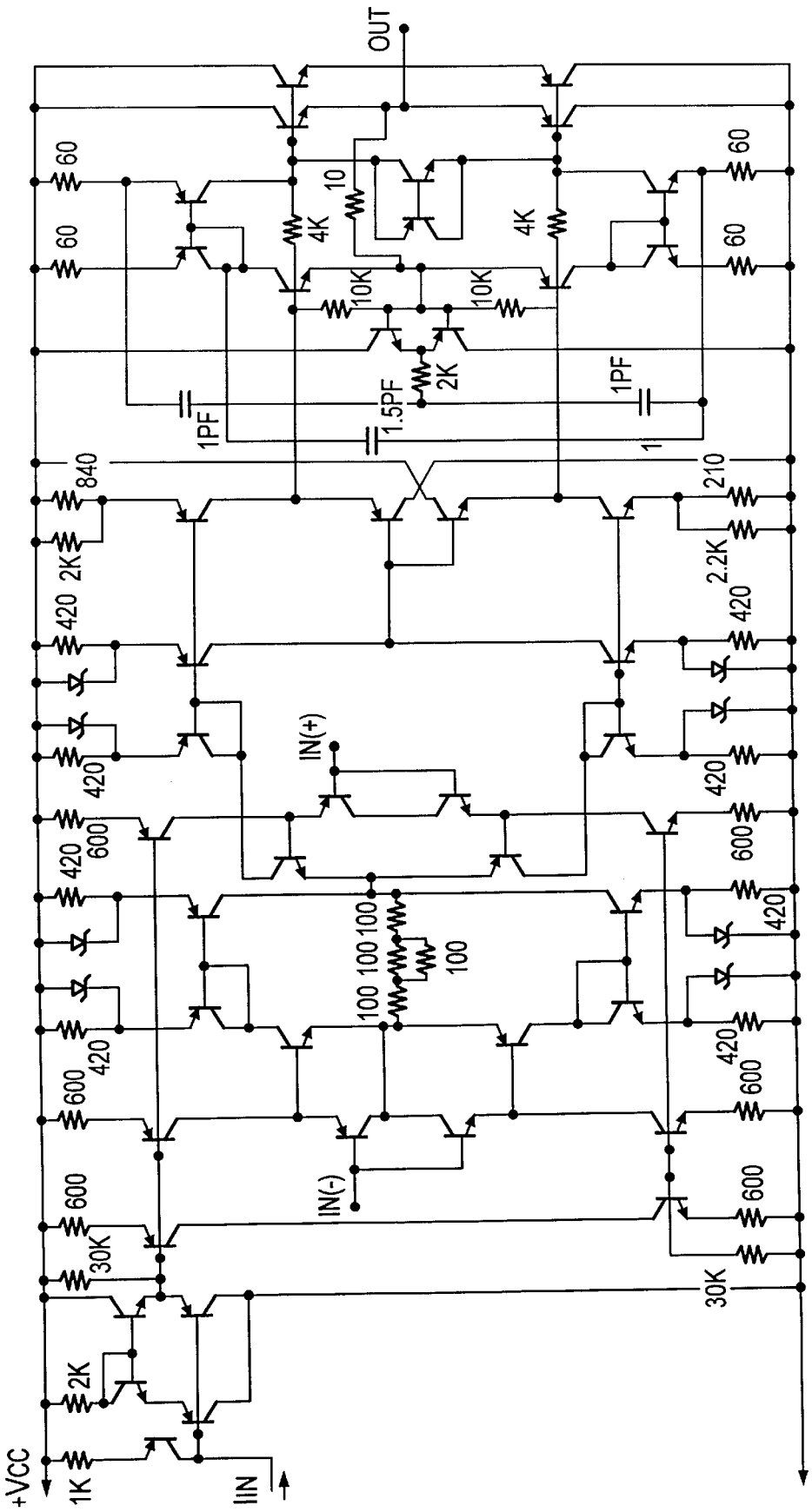
FIG. 11 is a circuit diagram of a particularly preferred exemplary embodiment of an operational amplifier in accordance with the present invention.

Having described in detail various preferred embodiments of an operational amplifier in accordance with the present invention, a preferred exemplary embodiment of an operational amplifier will now be described. With reference to FIG. 11, an operational amplifier 1100 configured as a voltage feedback amplifier is shown. Operational amplifier 110 comprises an input stage 1102 and an output stage 1104. Preferably, input stage 1102 comprises two unity gain buffers, 1110 and 1112, a bias rail buffer 1106 and a plurality of current mirrors. Accordingly, current mirrors 1118 and 1119 are configured for buffer 1110 and current mirrors 1122 and 1123 are configured for buffer 1112. Input stage 1102 further comprises a plurality of current sources, 1108, 1109, 1116, 1117, 1120 and 1121, suitably configured to provide current references to input buffers 1110 and 1112.

Output stage 1104 preferably comprises an output buffer 1128, compensation capacitors 1126 and 1127, a diode biasing circuit 1130 and a disabling circuit 1129. Compensation capacitors 1126 and 1127 are suitably configured to substantially eliminate the ringing imparted into output stage 1104 by bias rails VCC and VEE. Further, output stage 1104 includes current sources 1124 and 1125 suitably connected to current mirrors 1122 and 1123.

Figure 10:
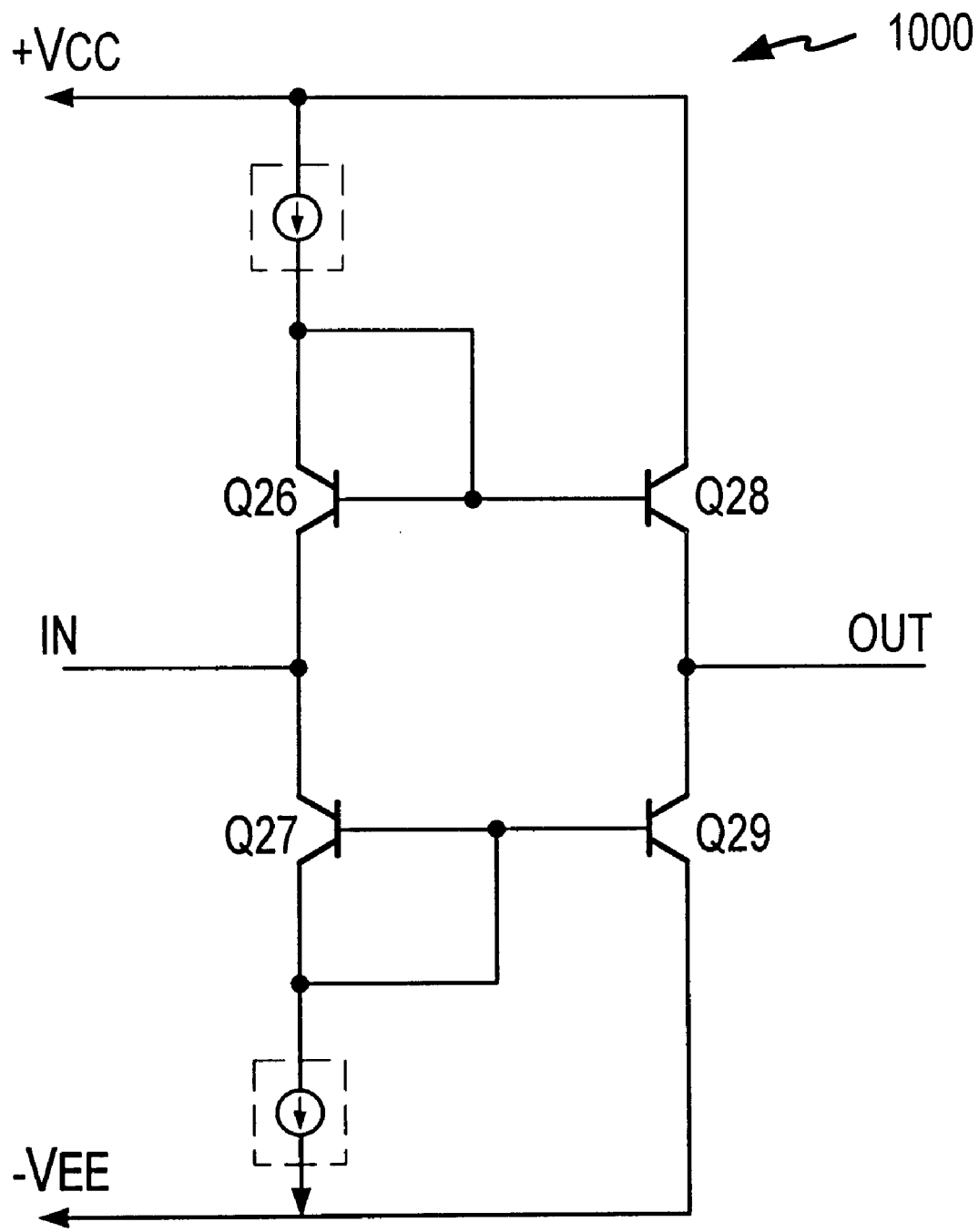
FIG. 10 is a circuit diagram of a preferred embodiment of an input stage buffer as may be utilized in a current feedback amplifier.

The various preferred embodiments discussed above may be suitably configured as a voltage feedback amplifier, a current feedback amplifier, and a closed-loop, fixed gain amplifier without departing from the scope of the present invention. For example, with reference to FIG. 2, a current feedback amplifier may be suitably provided through the use of an input stage comprising input buffer 220 and current mirrors 224 and 226, but not utilizing input buffer 210 or current mirrors 216 and 218. In accordance with a preferred embodiment, with reference to FIG. 10, a current feedback amplifier may also be provided by replacing an input buffer 210 with a buffer 1000. Accordingly, with the use of buffer 1000, a current feedback amplifier may further reduce the input voltage noise and input offset voltage.

The present invention has been described above with reference to a preferred embodiment. However, those skilled in the art will recognize that changes and modifications may be made to the preferred embodiment without departing from the scope of the present invention. For example, the various components may be implemented in alternate ways, such as, for example, PNP and NPN-type configurations, depending upon the particular application or in consideration of any number of factors associated with the operation of the system. In addition, the techniques described herein may be extended or modified for use with other integrated circuits separate from an operational amplifier. These and other changes or modifications are intended to be included within the scope of the present invention, as expressed in the following claims.

What is claimed is:

1. A method for providing a stable reference signal from a bias rail supply, said method comprising the steps of:

receiving an input reference signal into an a collector of an input transistor of a bias rail buffer circuit;

providing an output current reference to an output transistor of an output current source;

sourcing current into said output current source when voltage at a base of said output transistor is decreased; and sinking current from said output current source when voltage at said base of said output transistor is increased, and wherein external disturbances imparted onto said output current source from said bias rail supply are absorbed to provide said stable reference signal.

2. A method according to claim 1, wherein said step of sourcing current into said output current source comprises providing a first transistor of a second pair of complementary transistors, said first transistor sourcing current into said base of said output transistor.

3. A method according to claim 2, wherein said step of sinking current from said output current source comprises providing a second transistor of said second pair of complementary transistors, said second transistor sinking current into said base of said output transistor.

4. A method for providing a stable reference signal from a bias rail supply, said method comprising the steps of:

receiving a bias rail supply reference into a bias rail buffer circuit, said bias rail buffer circuit having a first pair of complementary transistors comprising a first transistor and a second transistor, said second transistor having a base and a collector connected together;

providing an output current reference to an output transistor of an output current source;

sourcing current into said output current source when voltage at a base of said output transistor is decreased; and sinking current from said output current source when voltage at said base of said output transistor is increased, and wherein external disturbances imparted onto said output current source from said bias rail supply are absorbed to provide said stable reference signal.

5. A method according to claim 4, wherein each of said first transistor and said second transistor comprises an emitter connected to a base of an input transistor.

6. A method according to claim 5, wherein a collector of said input transistor is connected to an input reference signal.

7. A method for providing a stable reference signal from a bias rail supply, said method comprising the steps of:

receiving a bias rail supply reference into a bias rail buffer circuit;

providing an output current reference to an output transistor of an output current source, said output transistor having a base connected to said bias rail buffer circuit, and an emitter coupled to the bias rail supply reference through a resistor;

sourcing current into said output current source when voltage at a base of said output transistor is decreased; and sinking current from said output current source when voltage at said base of said output transistor is increased, and wherein external disturbances imparted onto said output current source from said bias rail supply are absorbed to provide said stable reference signal.

8. A method according to claim 7, wherein said step of sourcing current into said output current source comprises providing a first transistor of a second pair of complementary transistors, said first transistor sourcing current into said base of said output transistor.

9. A method according to claim 2, wherein said step of sinking current from said output current source comprises providing a second transistor of said second pair of complementary transistors, said second transistor sinking current into said base of said output transistor.

10. A method for providing a stable reference signal from a bias rail supply, said method comprising the steps of:

receiving a bias rail supply reference into a bias rail buffer circuit;

providing an output current reference to an output transistor of an output current source;

sourcing current into said output current source when voltage at a base of said output transistor is decreased; and sinking current from said output current source when voltage at said base of said output transistor is increased, and wherein external disturbances imparted onto said output current source from said bias rail supply are absorbed to provide said stable reference signal.

11. A method according to claim 7, wherein said step of sourcing current into said output current source comprises providing a first transistor of a second pair of complementary transistors, said first transistor sourcing current into said base of said output transistor.

12. A method according to claim 2, wherein said step of sinking current from said output current source comprises providing a second transistor of said second pair of complementary transistors, said second transistor sinking current into said base of said output transistor.

* * * * *